(12) United States Patent
Song

(10) Patent No.: US 12,142,546 B2
(45) Date of Patent: Nov. 12, 2024

(54) HIGH VOLTAGE SEMICONDUCTOR DEVICE

(71) Applicant: DB HiTek Co., Ltd., Bucheon-si (KR)

(72) Inventor: Yang Hee Song, Anyang-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 349 days.

(21) Appl. No.: 17/573,455

(22) Filed: Jan. 11, 2022

(65) Prior Publication Data
US 2022/0285247 A1 Sep. 8, 2022

(30) Foreign Application Priority Data

Mar. 3, 2021 (KR) .................. 10-2021-0027821

(51) Int. Cl.
*H01L 29/423* (2006.01)
*H01L 23/485* (2006.01)
*H01L 29/78* (2006.01)

(52) U.S. Cl.
CPC ........ *H01L 23/485* (2013.01); *H01L 29/4238* (2013.01); *H01L 29/7816* (2013.01)

(58) Field of Classification Search
CPC ....... H01L 23/485; H01L 29/06; H01L 29/08; H01L 29/78; H01L 29/417; H01L 29/423; H01L 29/0649; H01L 29/0653; H01L 29/0692; H01L 29/0847; H01L 29/4238; H01L 29/42368; H01L 29/41758; H01L 29/7816; H01L 29/7835; H01L 29/7839; H01L 29/806; H01L 29/41791; H01L 29/41725; H01L 29/0843; H01L 29/0891; H01L 29/66; H01L 29/66636; H01L 29/66643; H01L 21/8238; H01L 21/8234; H01L 21/823418; H01L 21/823425; H01L 21/823814
USPC ....................................................... 257/335
See application file for complete search history.

(56) References Cited

U.S. PATENT DOCUMENTS

| 8,754,474 | B2 | 6/2014 | Ko | |
|---|---|---|---|---|
| 2010/0065909 | A1* | 3/2010 | Ichijo | H01L 29/66681 438/286 |
| 2012/0126322 | A1 | 5/2012 | Ko | |
| 2013/0020632 | A1* | 1/2013 | Disney | H01L 29/0847 257/E21.409 |
| 2016/0293777 | A1* | 10/2016 | Knaipp | H01L 29/0692 |
| 2018/0219093 | A1* | 8/2018 | Chou | H01L 23/49562 |
| 2020/0144381 | A1* | 5/2020 | Braun | H01L 29/7835 |
| 2021/0036112 | A1* | 2/2021 | Xu | H01L 29/66659 |
| 2022/0344479 | A1* | 10/2022 | Lee | H01L 29/42368 |

FOREIGN PATENT DOCUMENTS

KR 10-2012-0055139 A 5/2012

* cited by examiner

*Primary Examiner* — Chuong A Luu
(74) *Attorney, Agent, or Firm* — Andrew D. Fortney; Central California IP Group, P.C.

(57) ABSTRACT

Disclosed is a high voltage semiconductor device. More particularly, the present disclosure relates to a semiconductor device capable of improving the breakdown voltage characteristics in an off-state and in an on-state by electrically connecting a first source metal to a source in a core region and in corner regions.

10 Claims, 14 Drawing Sheets

HIGH VOLTAGE SEMICONDUCTOR DEVICE

CROSS REFERENCE TO RELATED APPLICATION

The present application claims priority to Korean Patent Application No. 10-2021-0027821, filed Mar. 3, 2021, the entire contents of which are incorporated herein for all purposes by this reference.

BACKGROUND OF THE INVENTION

Field of the Invention

The present disclosure relates to a high voltage semiconductor device. More particularly, the present disclosure relates to a semiconductor device capable of improving breakdown voltage characteristics in the on- and off-states by electrically connecting a first source metal to a source in a core region and in corner regions.

Description of the Related Art

A lateral double diffused metal oxide semiconductor (LDMOS) is a representative high power/high voltage device having a rapid switching response and a high input impedance. In particular, the LDMOS is currently entering the semiconductor market for vehicles, and the need for high voltage devices with a voltage (e.g., an operating voltage) of at least 100V has recently increased.

FIG. 1 is a plan view illustrating a conventional high voltage semiconductor device. FIG. 2 is a cross-sectional view illustrating the conventional high voltage semiconductor device of FIG. 1 taken along line a-a' in FIG. 1. FIG. 3 is a cross-sectional view illustrating the conventional high voltage semiconductor device taken along line b-b' in FIG. 1. FIGS. 2-3 are not drawn to scale, and the dimensions of the structures in FIGS. 2-3 do not necessarily match each other.

Referring to FIGS. 1 to 3, in a conventional high voltage semiconductor device 9, source metals (e.g., electrodes) 910 and a drain metal (e.g., electrode) 920 are formed only in a core region C1 of the substrate 901, and the source metals 910 and the drain metal 920 are not formed in corner regions C2. The source metals 910 cross the gate electrode 930 along an x-axis direction, overlap the gate electrode 930 in part along the y-axis direction, but are separated from the drain metal 920 by a gap along the x-axis direction. In addition, each of the source metals 910 is connected to a source contact 940, and the drain metal 920 is connected to a drain contact 950. In addition, the source contacts 940 and the drain contact 950 may extend in a vertical direction through a lower insulation film 960.

Generally, when the LDMOS having this structure is utilized as a high power device with a voltage of equal to or less than 100V, methods such as adjusting the length of the drift region by increasing the width of a gate field plate below the gate electrode 930 and adjusting an electric field in the drift region using a floating field plate (not illustrated) on the gate electrode 930 may increase the voltage tolerance of the device.

In addition, when the LDMOS having this structure is utilized as a high voltage semiconductor device with a voltage of at least 100V, voltages applied to each of the contact 940 and 950 and each of the metal 910 and 920 become relatively high, so that a device interference phenomenon caused by metal routing outside the device should be considered. Specifically, in the conventional high voltage semiconductor device 9, an electric field at the lower insulation film 960 becomes relatively strong when the device is on, so that interference occurs in electric fields in the drift region and the body region in the substrate 901. Therefore, the conventional high voltage semiconductor device 9 should be designed considering the electric fields in the off-state and the on-state.

In response to the consideration described above, the inventor of the present disclosure created a new high voltage semiconductor device having an improved structure.

DOCUMENT OF RELATED ART (Patent Document 1) Korean Patent Application Publication No. 10-2012-0055139 "LDMOS SEMICONDUCTOR DEVICE"

SUMMARY OF THE INVENTION

Accordingly, the present disclosure has been made keeping in mind the above problems occurring in the related art, and the present disclosure discloses a high voltage semiconductor device capable of improving the breakdown voltage characteristics in an off-state thereof and in an on-state thereof by electrically connecting a first source metal to a source in a core region and at least a portion of corner regions (e.g., of the high voltage semiconductor device).

In addition, another objective of the present disclosure is to provide a high voltage semiconductor device in which the internal design of the substrate is not significantly different from a conventional high voltage semiconductor device. Furthermore, the high voltage semiconductor device of the present disclosure has improved breakdown voltage characteristics in the on-state, thereby having a relatively high voltage/high power while also having substantially the same size as the conventional high voltage semiconductor device.

In addition, another objective of the present disclosure is to provide an improved high voltage semiconductor device with at least the same process efficiency as the conventional high voltage semiconductor device, since no additional processing is required to manufacture the high voltage semiconductor device of the present disclosure relative to the conventional high voltage semiconductor device.

The present disclosure may be implemented by one or more embodiments having some or all of the following configurations, to achieve one or more of the above-described objectives.

In one or more embodiments of the present disclosure, there is provided a high voltage semiconductor device (which may have a core region and a plurality of corner regions), including a substrate; a gate on the substrate; a body region in or the substrate; a drift region in the substrate (e.g., on a side of a channel opposite from the body region); a source in the body region; a drain in the drift region; a first source metal electrically connected to the source by a first source contact; and a first drain metal electrically connected to the drain by a first drain contact, wherein the first source metal has a portion inside corner regions (e.g., of the device) and a core region (e.g., of the device), and the first drain metal is spaced apart from the first source metal along a lateral direction in the core region and inside the gate.

In a further embodiment, the first source metal may overlap the gate in the corner regions (e.g., in a vertical direction).

In a further embodiment of any of the above embodiments, the high voltage semiconductor device may further include a body contact adjacent to or in contact with the source, in the body region.

In a further embodiment of any of the above embodiments, the high voltage semiconductor device may further include a silicide film on the source, the body contact, the gate (e.g., a gate electrode) and/or the drain.

In a further embodiment of any of the above embodiments, the high voltage semiconductor device may further include a gate field plate between the gate and the drain.

In a further embodiment of any of the above embodiments, the first source metal may extend to the corner regions from the core region.

In one or more embodiments of the present disclosure, there is provided a high voltage semiconductor device including a substrate; a gate on the substrate; a body region in the substrate; a drift region in the substrate (e.g., on a side of a channel opposite from the body region); a source in the body region; a drain in the drift region; a first source metal electrically connected to the source by a first source contact, the first source metal extending to corner regions (e.g., of the device) from a core region (e.g., of the device); a first drain metal electrically connected to the drain by a first drain contact; and a second drain metal above the first drain metal, electrically connected to the first drain metal by a second drain contact, wherein the second drain metal may extend up to one of the corner regions from the core region.

In a further embodiment, the second drain metal may extend in a direction that does not match (e.g., that may be different from) a direction of a current path in the core region.

In a further embodiment of any of the above embodiments, the second drain metal may extend in a direction substantially orthogonal to the direction of the current path in the core region.

In a further embodiment of any of the above embodiments, the second drain metal may completely overlap the first drain metal (e.g., in a vertical direction).

In a further embodiment of any of the above embodiments, the gate may include a gate insulation film on the substrate; a gate electrode on the gate insulation film; and a gate spacer covering a sidewall of the gate electrode.

In a further embodiment of any of the above embodiments, the high voltage semiconductor device may further include a gate field plate between the gate and the drain; and a device insulation film at a border of the drain.

In one or more embodiments of the present disclosure, there is provided a high voltage semiconductor device including a substrate; a gate on the substrate; a body region in the substrate; a drift region in the substrate (e.g., on a side of a channel opposite from the body region); a source in the body region; a drain in the drift region; a first source metal electrically connected to the source by a first source contact, the first source metal extending to corner regions (e.g., of the device) from a core region (e.g., of the device); a second source metal electrically connected to the first source metal by a second source contact (e.g., and extending from the core region into the corner regions); a third source metal electrically connected to the second source metal by a third source contact (e.g., and extending across the core region); and a first drain metal electrically connected to the drain by a first drain contact, wherein the third source metal overlaps at least a portion of the first drain metal (e.g., along a vertical direction).

In a further embodiment, the first source metal may overlap the gate in the corner regions (e.g., in the vertical direction).

In a further embodiment of any of the above embodiments, the third source metal may cross or completely overlap the gate (e.g., the entire gate) in the core region.

In a further embodiment of any of the above embodiments, the third source metal may extend substantially orthogonally to the first drain metal (e.g., in a longitudinal direction).

In a further embodiment of any of the above embodiments, the high voltage semiconductor device may further include a gate field plate between the gate and the drain; a device insulation film at a border of the drain; and a body contact in the body region.

According to the above configurations, the present disclosure has the following effects.

An effect that is capable of improving the breakdown voltage characteristics in an off-state and in an on-state may be realized since the high voltage semiconductor of the present disclosure is configured such that the first source metal that is electrically connected to the source in the core region and also in at least a portion of the corner regions.

In addition, there difference in the internal design of the substrate between the high voltage semiconductor device of the present disclosure and the conventional high voltage semiconductor device is not significant. Furthermore, the high voltage semiconductor device of the present disclosure has improved on-state breakdown voltage characteristics. Therefore, the high voltage semiconductor device of the present disclosure can have a relatively high voltage/high power and substantially the same size as the conventional high voltage semiconductor device.

In addition, process efficiency may be maintained since no additional processing is required to manufacture the high voltage semiconductor device of the present disclosure relative to the conventional high voltage semiconductor device.

Meanwhile, though not explicitly mentioned, effects described in the present specification and tentative effects expected from the technical features of the present specification will be treated as if described in the present specification of the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
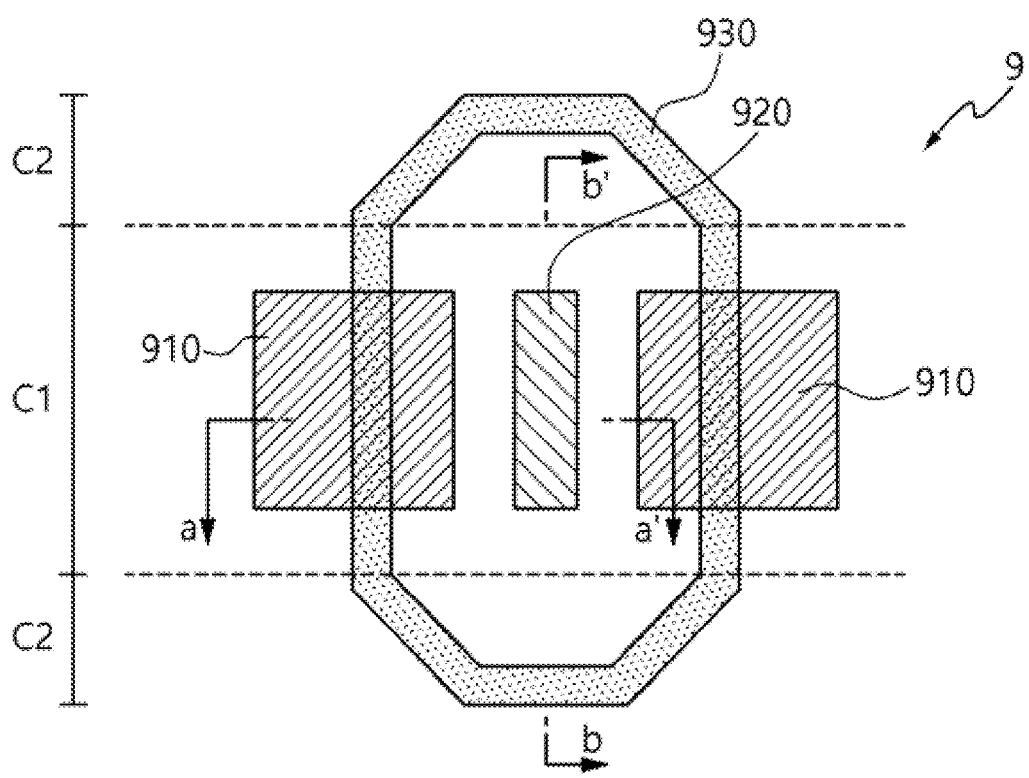
FIG. 1 is a plan view illustrating a conventional high voltage semiconductor device.

Hereinafter, embodiments of the present disclosure will be described in detail with reference to accompanying drawings. Various changes to the following embodiments are possible and the scope of the present disclosure is not limited to the following embodiments. The patent right of the present disclosure should be defined by the scope and spirit of the present disclosure as recited in the accompanying claims. In addition, embodiments of the present disclosure are intended to fully describe the present disclosure to a person having ordinary knowledge in the art to which the present disclosure pertains.

As used in this specification, a singular form may, unless definitely indicating a particular case in terms of the context, include a plural form. Also, the expressions "comprise" and/or "comprising" used in this specification neither define the mentioned shapes, numbers, steps, operations, members, elements, and/or groups of these, nor exclude the presence or addition of one or more other different shapes, numbers, steps, operations, members, elements, and/or combinations thereof.

Hereinafter, when it is described that a component (or a layer) is referred to as being "on" another component (or another layer), it should be understood that the component is directly on the other component, or one or more intervening components (or layers) are also present. In contrast, when it is described that a component is referred to as being directly on to another component, it should be understood that there is (are) no intervening component(s) present. In addition, the terms indicating positions, such as "on", "upper", "lower", "upper side", "lower side", "first side", and "side surface," are intended to mean a relative position of the components.

In addition, when a specific embodiment may be implemented differently, a specific process order may be performed differently from the described order. For example, two consecutively described processes may be performed substantially at the same time or performed in an order opposite to the described order.

The term "metal-oxide semiconductor" (MOS) as used herein is a general term, and the metal "M" is not limited only to metal, but may be any conductive material. In addition, the semiconductor "S" may be a substrate or a semiconductor material or structure, and the oxide "O" is not limited only to an oxide, but may include any of various types of organic materials or inorganic dielectric materials.

In addition, conductivity types or doped areas of elements may be defined as "p-type" or "n-type" according to main carrier characteristics, but this is only for convenience of description, and the technical idea of the present disclosure is not limited thereto. For example, hereinafter, the "p-type" or "n-type" may be replaced with more general terms, such as "first conductivity type" or "second conductivity type". Herein, "first conductivity type" may refer to p-type conductivity, and "second conductivity type" may refer to n-type conductivity.

In addition, it is to be understood that the terms "high-concentration," "heavily doped," "lightly doped" and "low-concentration" in reference to the concentration or dose of a dopant in an impurity region refer to relative doping concentrations of one impurity region relative to one or more other impurity regions.

Figure 4:
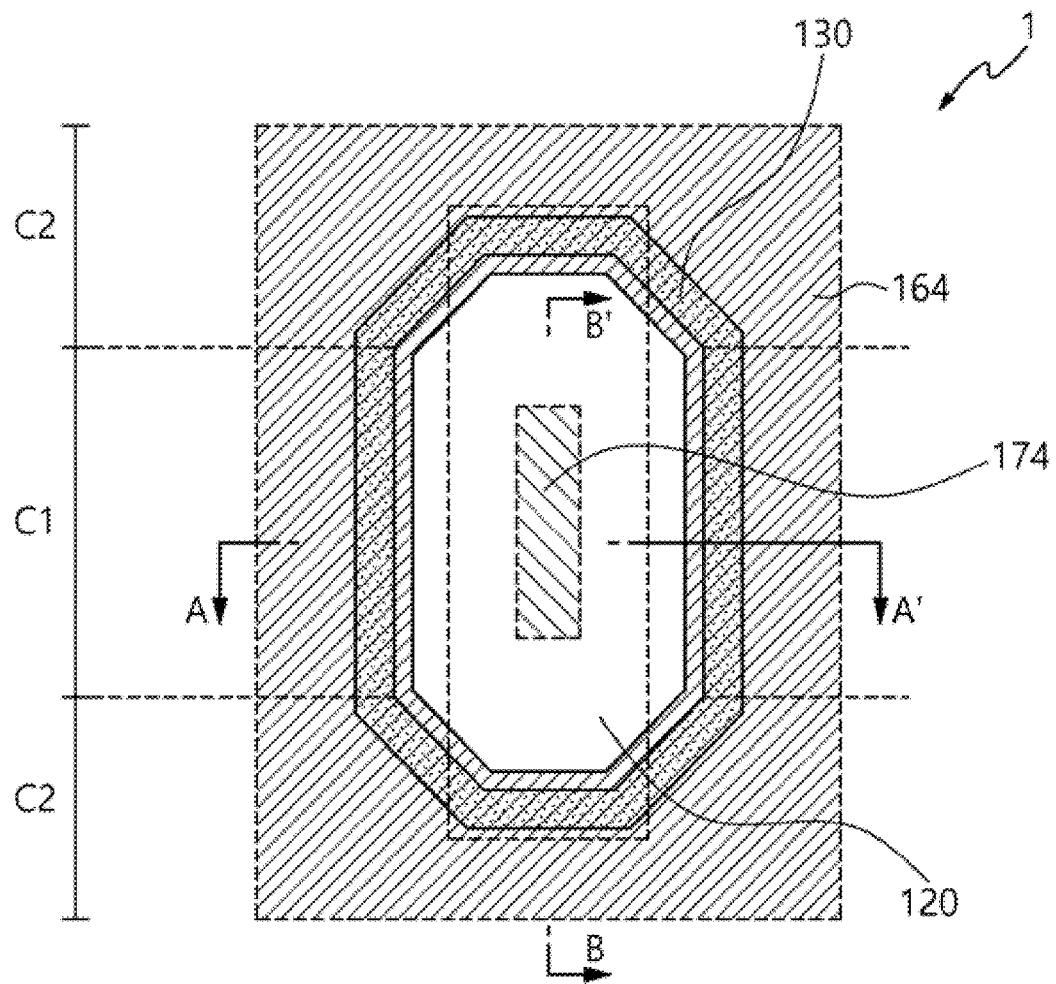
FIG. 4 is a plan view illustrating a high voltage semiconductor device according to one or more embodiments of the present disclosure.
Figure 5:
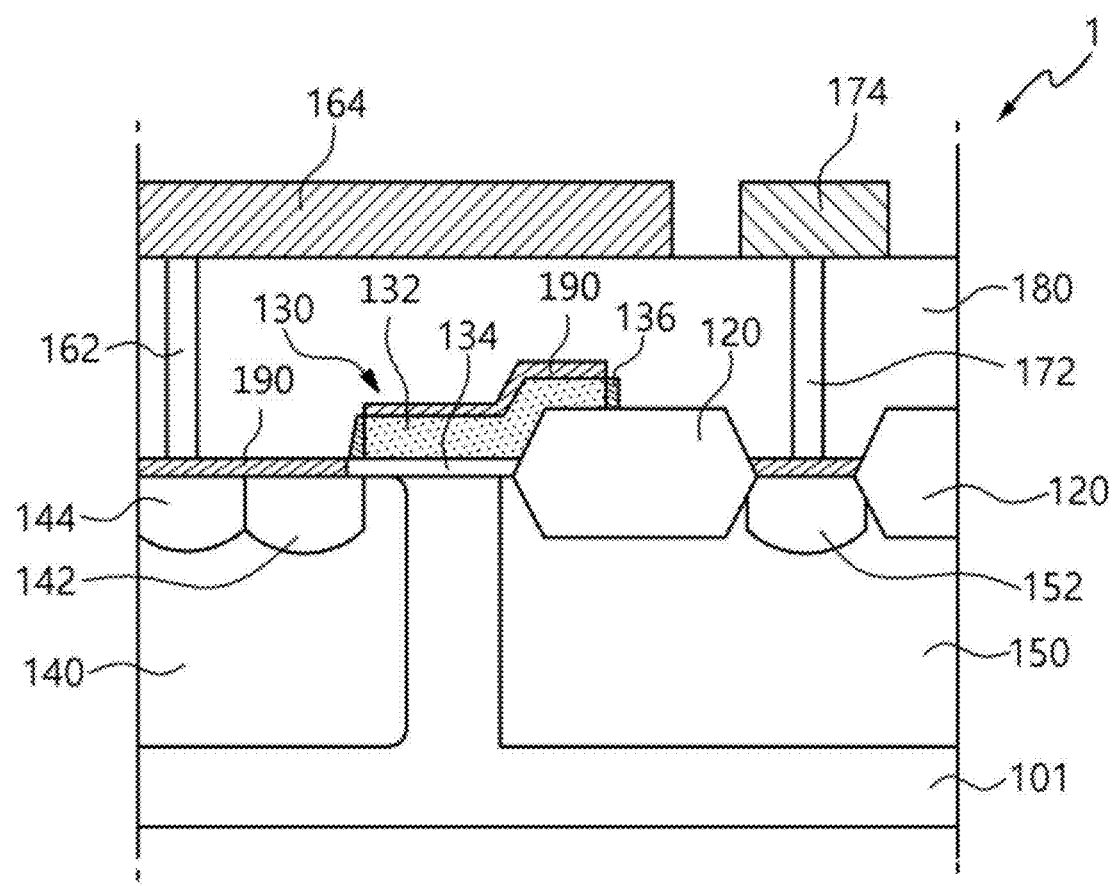
FIG. 5 is a cross-sectional view illustrating the high voltage semiconductor device of FIG. 4 taken along line A-A' in FIG. 4.
Figure 6:
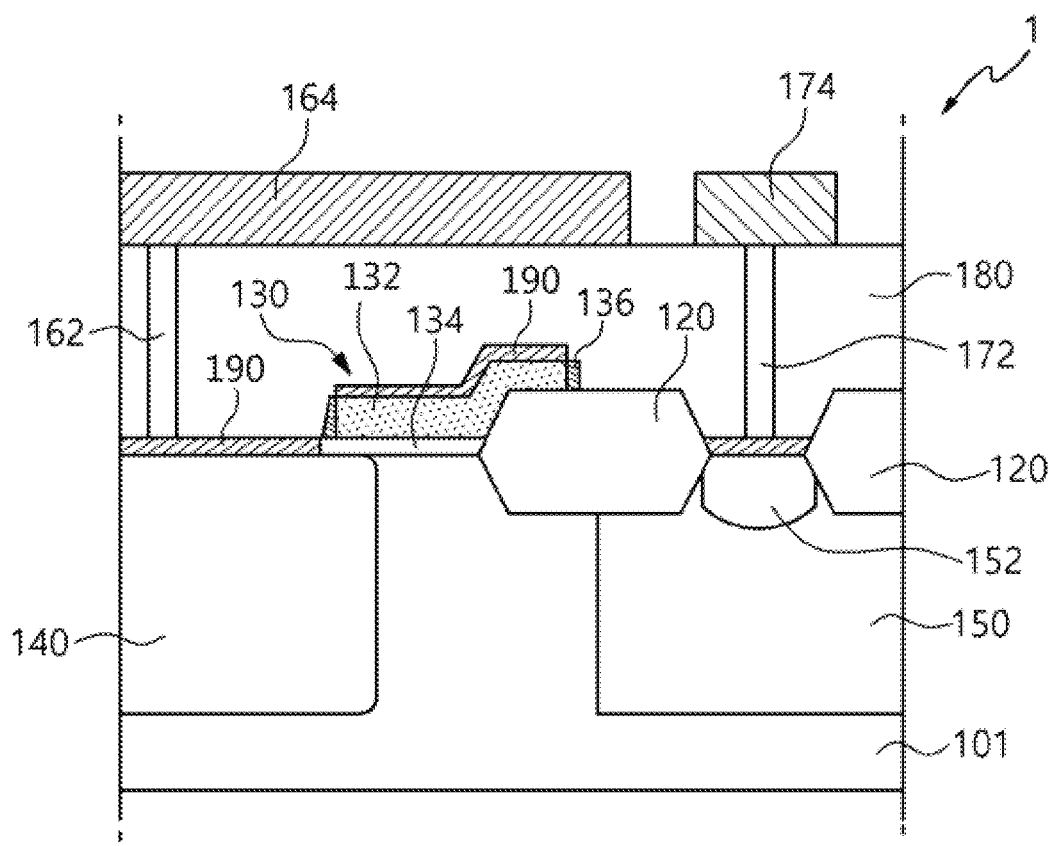
FIG. 6 is a cross-sectional view illustrating the high voltage semiconductor device of FIG. 4 taken along line B-B' in FIG. 4.

FIG. 4 is a plan view illustrating a high voltage semiconductor device according to one or more embodiments of the present disclosure, FIG. 5 is a cross-sectional view illustrating the high voltage semiconductor device of FIG. 4 taken along line A-A' in FIG. 4, and FIG. 6 is a cross-sectional view illustrating the high voltage semiconductor device of FIG. 4 taken along line B-B' in FIG. 4.

Hereinafter, a high voltage semiconductor device 1 according to an embodiment (a first embodiment) of the present disclosure will be described in detail with reference to accompanying drawings. For example, the high voltage semiconductor device that will be described below may be a pLDMOS device, but may be an nLDMOS device on the contrary, and the scope of the present disclosure is not limited to a specific example.

Referring to FIGS. 4 to 6, the present disclosure relates to the high voltage semiconductor device 1. More particularly, the present disclosure relates to a semiconductor device capable of improving the breakdown voltage characteristics in both an off-state and an on-state by electrically connecting a first source metal to a source in a core region and in corner regions of the device.

Hereinafter, in the high voltage semiconductor device 1 shown in FIGS. 4, 8 and 12, along a y-axis direction, a center portion of the device 1 including a channel region (which serves as a current path) is referred to as a "core region" C1, and portions outside the core region C1 and that do not include the channel region are referred to as "corner regions" C2. The corner regions C2 may also be those regions of the device 1 in which the gate 130 has a long axis at an angle other than 180° relative to the sections of the gate 130 in the core region C1 (in which the sections of the gate 130, the body region 140 and the drift region 150 all have long axes that are parallel to each other). Along the y-axis direction, two corner regions C2 (or an integer multiple thereof) may be at opposite distal ends of the core region C1.

The high voltage semiconductor device 1 may be on a substrate 101 according to one or more embodiments of the present disclosure. A well region (not identified) that may be utilized as an active region may be on the substrate 101. The active region may be defined by a device isolation film (not shown). The substrate 101 may be or comprise a single-crystal silicon wafer doped with a first conductive type dopant, or containing a p-type diffusion region therein or a p-type epitaxial layer grown thereon. The device isolation film may be formed by a shallow trench isolation (STI) process, but there is no specific limitation thereto.

In addition, it is preferable that a gate field plate 120 is between the gate 130 and the drain 152 that will be described later, thereby preventing an electric field from concentrating at an edge portion of the gate 130. The gate field plate 120 may be formed by a local oxidation of silicon (LOCOS) process.

The gate 130 is on a surface of the substrate 101. More specifically, the gate 130 may be on the active region, between the source 142 and the drain 152, on the surface of the substrate 101. That is, the gate 130 may be on or over the channel region of the device 1. The gate 130 may include a gate electrode 132; a gate insulation film 134 between the gate electrode 132 and the surface of the substrate 101; and a gate spacer 136 covering a sidewall of the gate electrode 132.

For example, the gate electrode 132 may be or comprise conductive polysilicon, a metal, a conductive metal nitride, a refractory metal silicide, or a combination thereof, and may be formed by a process such as chemical vapor deposition (CVD), physical vapor deposition (PVD), atomic layer deposition (ALD), metal-organic atomic layer deposition (MOALD), metal-organic chemical vapor deposition (MOCVD), or the like. In addition, for example, the gate insulation film 134 may be or comprise a silicon oxide film, a high-k dielectric layer, or a combination thereof, and may be formed by a process such as ALD, CVD, PVD, or the like. In addition, for example, the gate spacer 136 may be or comprise an oxide film (e.g., silicon dioxide), a nitride film (e.g., silicon nitride), or a combination thereof.

In addition, a body region 140 may be in the substrate 101, at the uppermost surface thereof. The body region 140 may be doped with a second conductive type dopant, and may be spaced apart from the drift region 150 in the substrate 101 along a lateral direction by a predetermined distance. In addition, the source 142 may be in the body region 140 and at the surface of the substrate 101, and a body contact 144 may be adjacent to or in contact with the source 142. The source 142 may be doped with a high-concentration of a second conductive type dopant, and the body contact 144 may be doped with a high-concentration of a first conductive type dopant. In addition, the source 142 and the body contact 144 may be in the core region C1, but not in the corner regions C2.

In addition, a drift region 150 may be in the substrate 101, at the surface of the substrate 101. As described above, the drift region 150 and the body region 140 are spaced apart from each other by the predetermined distance along the lateral direction. When the dopant dose or concentration in the drift region 150 is equal to or less than a predetermined level, an on-resistance Rsp may deteriorate, whereas when the dopant dose or concentration in the drift region 150 is at least the predetermined level, the on-resistance Rsp may improve, but the breakdown voltage may deteriorate or may not be at a target level, so it is preferable for the drift region 150 to have an appropriate dopant dose or concentration for the corresponding and/or target electrical characteristics. It is more preferable that the dopant dose or concentration of the drift region 150 is less than the dopant dose or concentration of the drain 152.

The drain 152 may be in the drift region 150 and at the surface of the substrate 101, and the drain 152 may be doped with a high concentration or dose of a first conductive type dopant. The drain 152 may also be in the core region C1, but not in the corner regions C2.

In addition, a first source contact 162 is on the body contact 144, thereby electrically connecting it to the source 142 and/or the body region 140. The first source contact 162 may extend upward from the body contact 144, and an upper portion of the first source contact 162 is electrically connected to a first source metal 164. For example, the first source contact 162 and the first source metal 164 may be or comprise a conductive metal such as copper, aluminum, tungsten, or the like, or a conductive metal material (e.g., a conductive material containing a metal, such as a refractory metal nitride or a refractory metal silicide), but the scope of the present disclosure is not limited to a specific example. In addition, the first source contact 162 may extend in a vertical direction and/or penetrate through a lower insulation film 180 on the substrate 101. The lower insulation film 180 may be or comprise a pre-metal dielectric (PMD) layer, since the lower insulation film 180 is formed before both the first source metal 164 that is a wiring layer and a first drain metal 174 that will be described later are formed.

The first source metal 164 is at least in part in the core region C1. For example, in the core region C1, the first source metal 164 may cross or completely overlap the gate 130, and may be adjacent to, but spaced apart from, the first drain metal 174 that will be described later. In addition, the first source metal 164 may also be in the corner regions C2. That is, the first source metal 164 may be in at least a portion of the corner regions C2, and it is preferable that the first source metal 164 crosses or completely overlaps the gate 130 in the corner regions C2.

In addition, a first drain contact 172 is electrically connected to and on the drain 152. The first drain contact 172 may extend upward from the drain 152, and may penetrate through the lower insulation film 180. In addition, an upper portion of the first drain contact 172 is electrically connected to the first drain metal 174. The first drain contact 172 and the first drain metal 174 may also be or comprise a conductive metal or metal material. Unlike the first source metal 164, the first drain metal 174 is only in the core region C1. More particularly, in the core region C1, the first drain metal 174 may be completely inside a region defined by the gate 130.

Hereinafter, a structure and a problem of a conventional high voltage semiconductor device and a structure of the high voltage semiconductor device according to the present disclosure for solving the problem will be described in detail with reference to the accompanying drawings.

Figure 2:
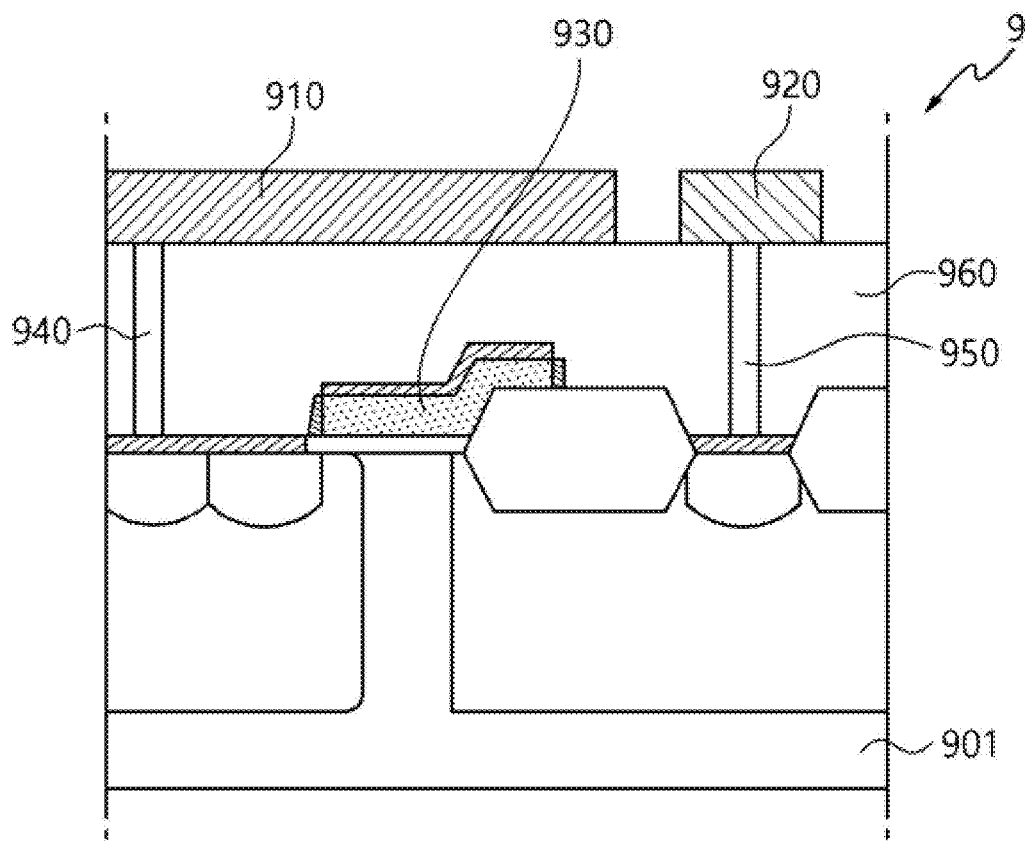
FIG. 2 is a cross-sectional view illustrating the conventional high voltage semiconductor device of FIG. 1 taken along line a-a' in FIG. 1.
Figure 3:
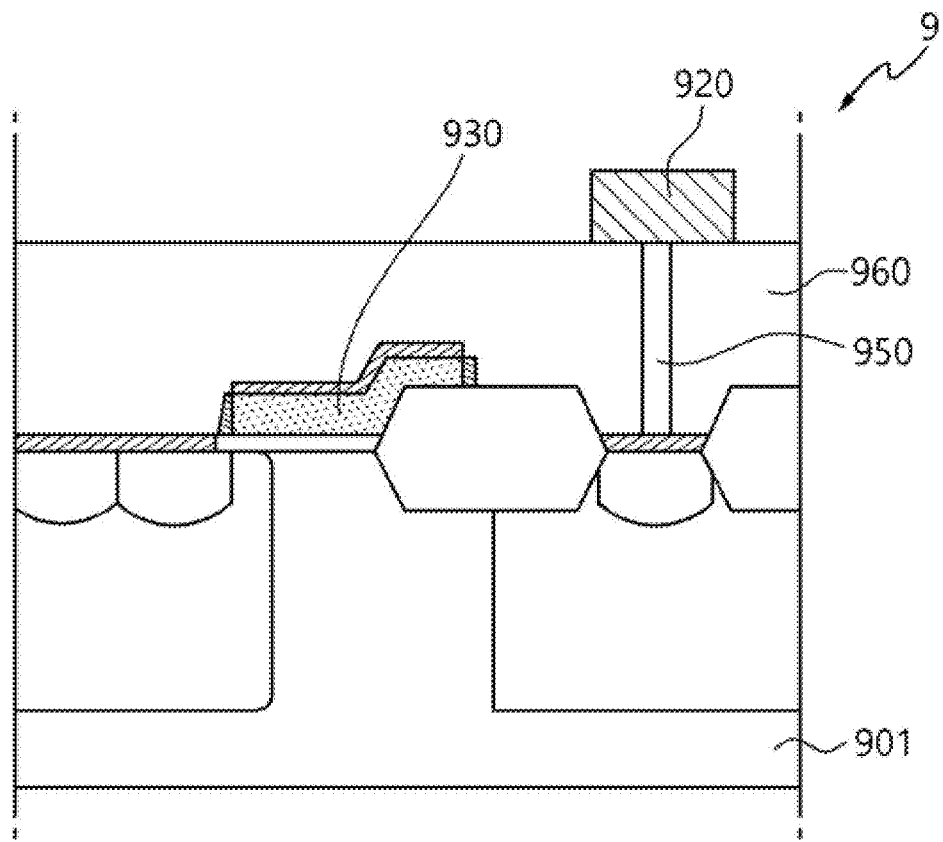
FIG. 3 is a cross-sectional view illustrating the conventional high voltage semiconductor device taken along line b-b' in FIG. 1.

Referring to FIGS. 1 to 3, in a conventional high voltage semiconductor device 9, source metals 910 and a drain metal 920 are only in a core region C1 of a substrate 901, and the source metals 910 and the drain metal 920 are not in corner regions C2. The source metals 910 cross a gate electrode 930 along the x-axis direction, and are adjacent to (but spaced apart from) the drain metal 920. In addition, one or more of the source metals 910 is (are) connected to a source contact 940, and the drain metal 920 is connected to a drain contact 950. In addition, the source contact 940 and the drain contact 950 may extend in the vertical direction and/or penetrate through a lower insulation film 960.

Generally, when an LDMOS transistor having this structure is utilized as a high power device with a voltage of equal to or less than 100V, methods such as adjusting the length of the drift region by increasing the width of the gate field plate below the gate electrode 930 and adjusting the electric field in the drift region by a floating field plate (not illustrated) on or under the gate electrode 930 are generally used in order to increase the voltage that the device can withstand or tolerate.

In addition, when the device is utilized as a high voltage semiconductor device with a voltage of at least 100V, voltages applied to each of the contact 940 and 950 and each of the metal 910 and 920 become relatively high, so that device interference caused by metal routing outside the device should be considered. Specifically, in the conventional high voltage device 9, an electric field at the lower insulation film 960 becomes relatively strong in an on-state, so that interference may occur in electric fields of the drift region and the body region in the substrate 901. Therefore, the conventional high voltage semiconductor device 9 should be designed considering the electric fields in the off-state and the on-state.

To solve this, as described above, referring to FIGS. 4 to 6, in the high voltage semiconductor device 1 according to the present disclosure, the first source metal 164 extends from the core region C1 up to (and optionally, at least partially in) the corner regions C2.

Figure 7:
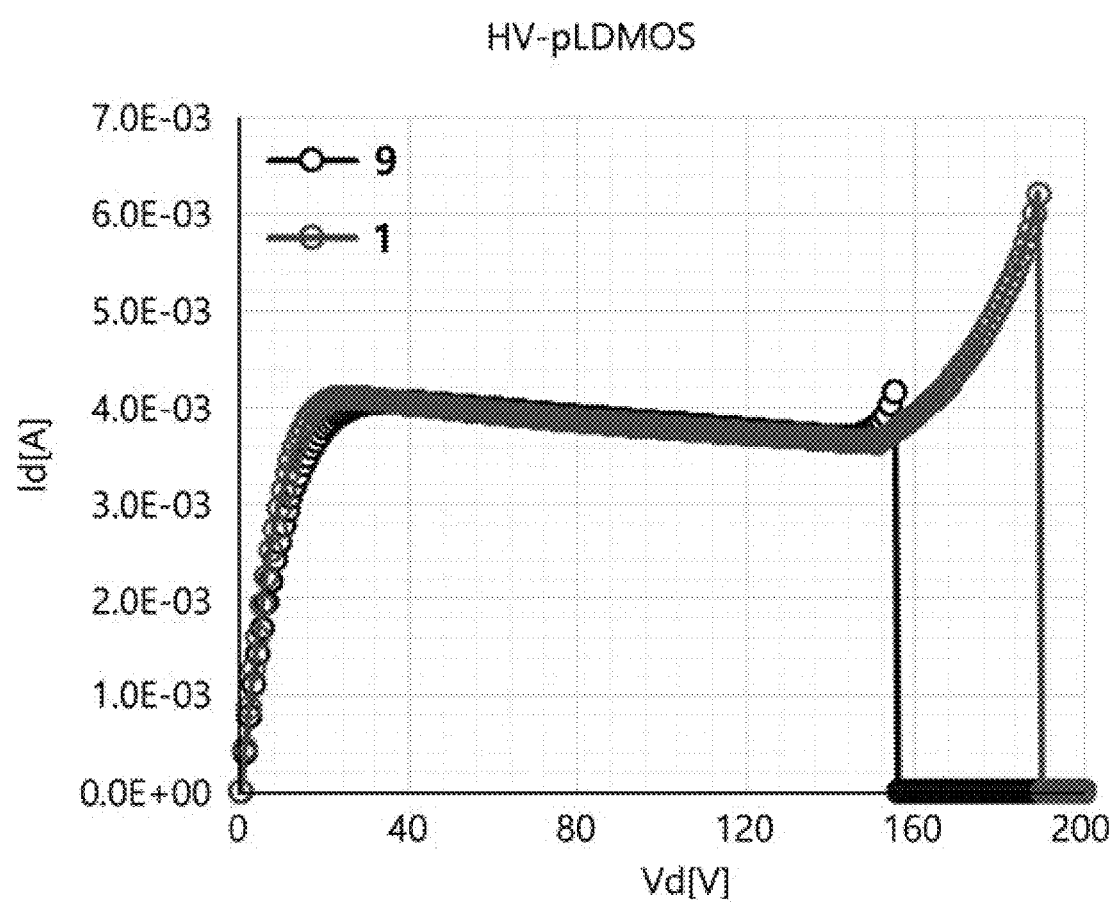
FIG. 7 is a graph showing on-state breakdown voltage values of the high voltage semiconductor device of FIG. 4 and the conventional high voltage semiconductor device.

FIG. 7 is a graph showing comparison between the high voltage semiconductor device according to FIG. 4 and a conventional high voltage semiconductor device in terms of the breakdown voltage in the on-state.

Referring to FIG. 7, in the conventional high voltage semiconductor device 9, device destruction occurs when the on-voltage is about or above 150V. However, in the high voltage semiconductor device 1 according to the present disclosure, the high voltage semiconductor device 1 withstands on-voltages up to about 190V. Therefore, since there is no significant internal design difference (up to the first level of metal, which includes the first source metal 164 and the first drain metal 174, and which can be made by substantially the same process) between the high voltage semiconductor device 1 according to the present disclosure and the conventional high voltage semiconductor device 9, the high voltage semiconductor device 1 can be manufactured in substantially the same size as the conventional high voltage semiconductor device 9, and can be utilized as a device having a relatively high voltage/high power, so that there is an advantage in terms of the operating voltage, without a difference in processing cost. Also, there is also an advantage that there is no need to add processing steps to the manufacturing process of the conventional high voltage semiconductor device 9 when the high voltage semiconductor device 1 according to the present disclosure is manufactured. In addition, the high voltage semiconductor device 1 according to the present disclosure is not limited to high voltage semiconductor devices with a voltage of at least 100V. For example, the high voltage semiconductor device 1 may be used as a device with a voltage of less than 100 V (e.g., at least 40V), and there is no specific limitation thereto.

Figure 8:
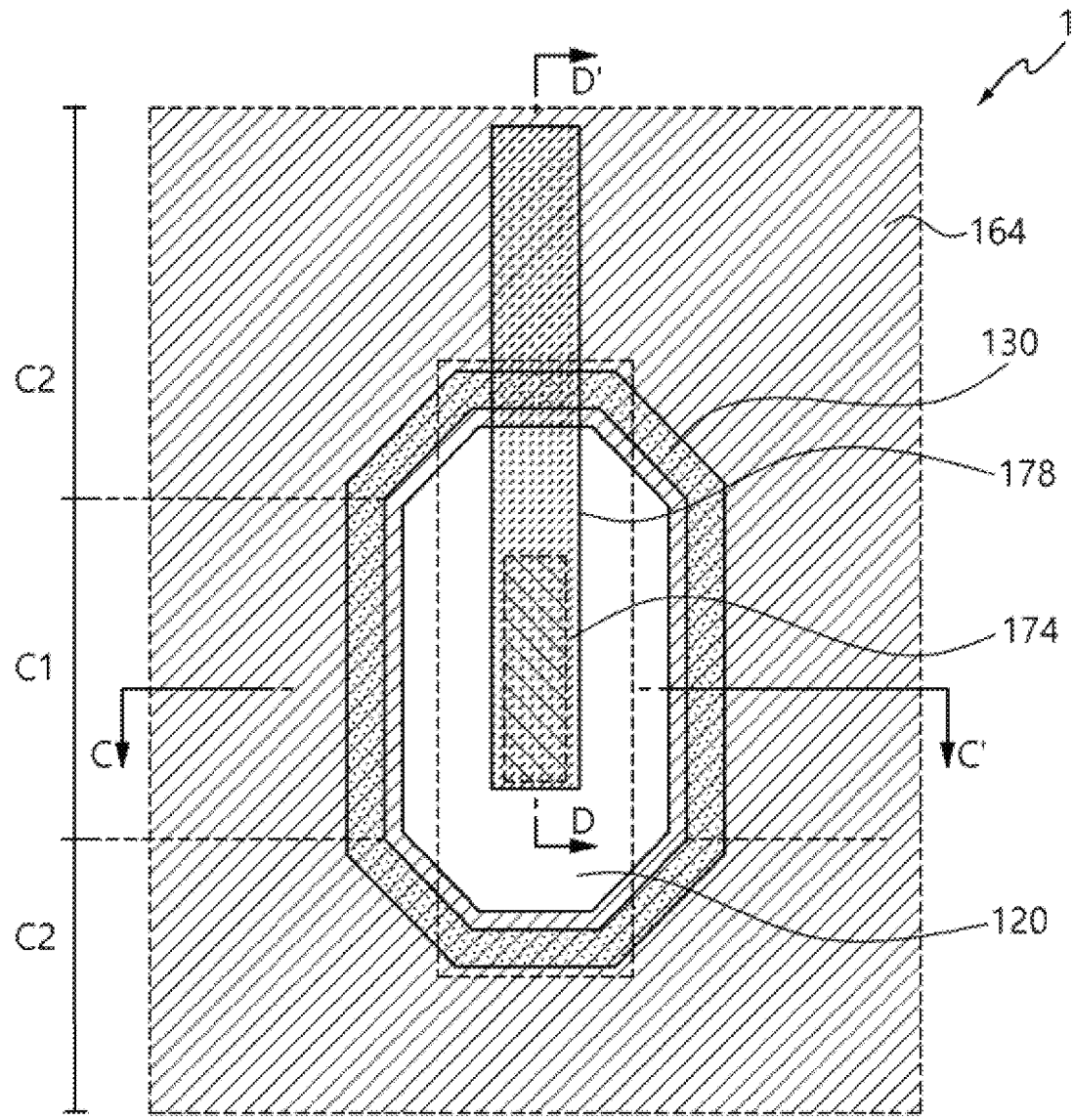
FIG. 8 is a plan view illustrating a high voltage semiconductor device in which a second drain metal is added to the high voltage semiconductor device of FIG. 4.
Figure 9:
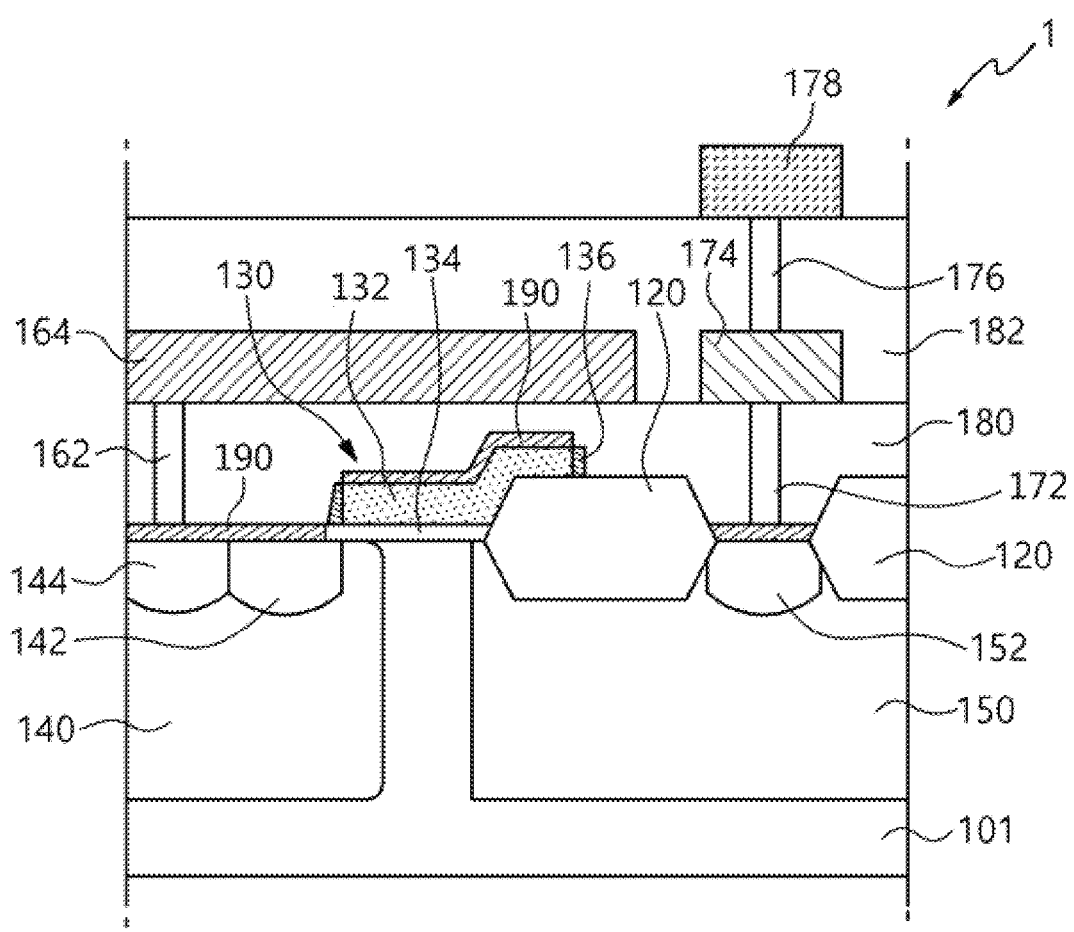
FIG. 9 is a cross-sectional view illustrating the high voltage semiconductor device of FIG. 8 taken along line C-C' in FIG. 8.
Figure 10:
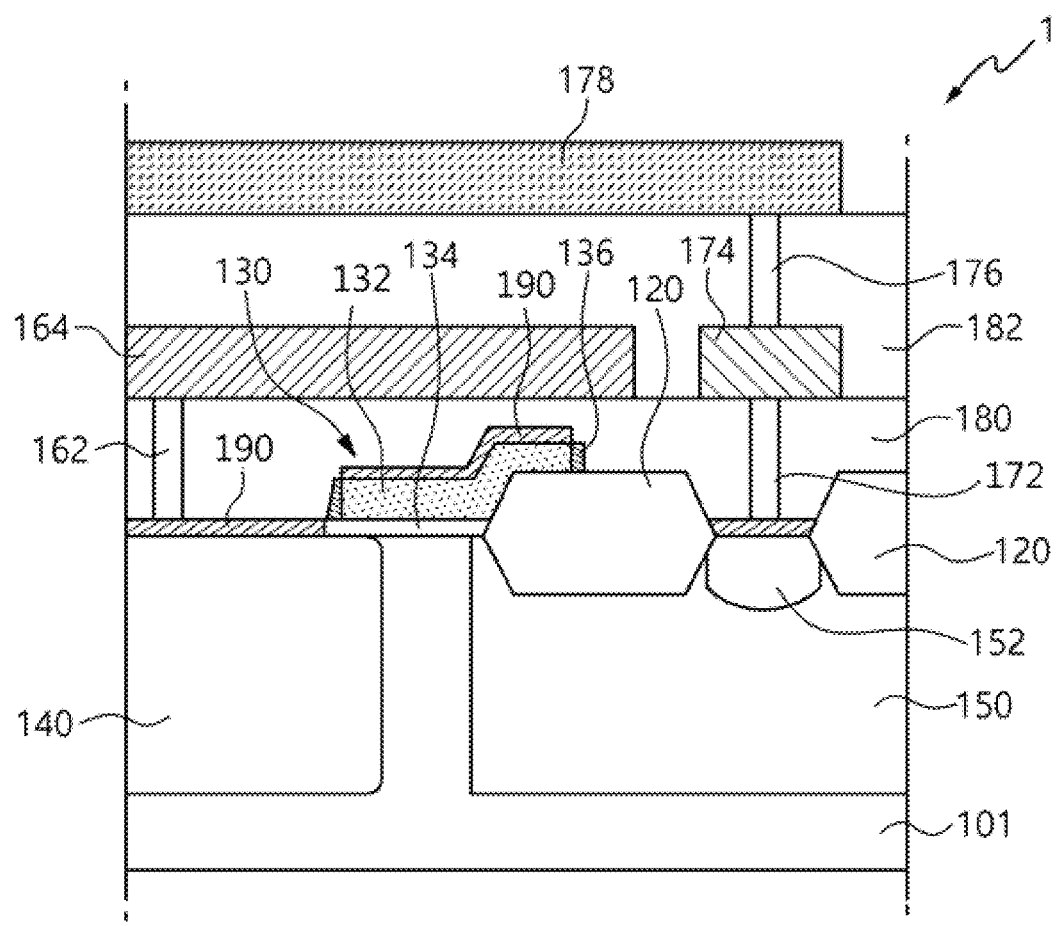
FIG. 10 is a cross-sectional view illustrating the high voltage semiconductor device of FIG. 8 taken along line D-D' in FIG. 8.

FIG. 8 is a plan view illustrating the high voltage semiconductor device 1 of FIG. 4 in which a second drain metal is added, FIG. 9 is a cross-sectional view illustrating the high voltage semiconductor device of FIG. 8 taken along line C-C' in FIG. 8, and FIG. 10 is a cross-sectional view illustrating the high voltage semiconductor device of FIG. 8 taken along line D-D' in FIG. 8.

Hereinafter, the high voltage semiconductor device according to another embodiment (a second embodiment) of the present disclosure will be described in detail with reference to the accompanying drawings. The second embodiment has a structure in which a second drain contact 176 and a second drain metal 178 are added, so only the additional structures and/or configuration will be described for convenience.

Referring to FIGS. 8 to 10, the second drain contact 176 is connected to and may extend upward from the first drain metal 174. The second drain contact 176 may penetrate through an intermediate insulation film 182. In addition, an upper portion of the second drain contact 176 is electrically connected to the second drain metal 178. The second drain metal 178 may extend from the core region C1 to one corner region C2 adjacent to the core region C1.

For example, the second drain metal 178 may extend over the first drain metal 174 in the y-axis direction (FIG. 8). That is, the second drain metal 178 has a long axis in a direction about 90 degrees from the current path between the source 142 and the drain 152, and the second drain metal 178 may not overlap with the current path, so that the possibility of an electric field disturbance (e.g., in the current path between the source 142 and the drain 152, typically considered to be the channel of the transistor) may be minimized. Accordingly, since the second drain metal 178 extends along the y-axis direction in FIG. 8, the concentration of an electric field on the surface of the substrate 101 in the core region C1 may be advantageously reduced. The second drain contact 176 and the second drain metal 178 may be or comprise a conductive metal or metal material, as described herein.

When the second drain metal 178 has a long axis that extends in the core region C1 in a direction substantially the same as the current path, the first source metal 164 and the second drain metal 178 may generate a high voltage difference, cross each other or overlap (e.g., along the vertical direction) in the core region C1 where the current flows, and an intensity of the electric field (e.g., in the transistor channel) may increase, so that the breakdown voltage of the device in the on-state decreases. On the contrary, when the second drain metal 178 extends in a direction that does not match and/or does not overlap the current path as in the present disclosure, a dense electric field may form in the corner region C2, so that the breakdown voltage of the device in the on-state may have a relatively high value.

Figure 11:
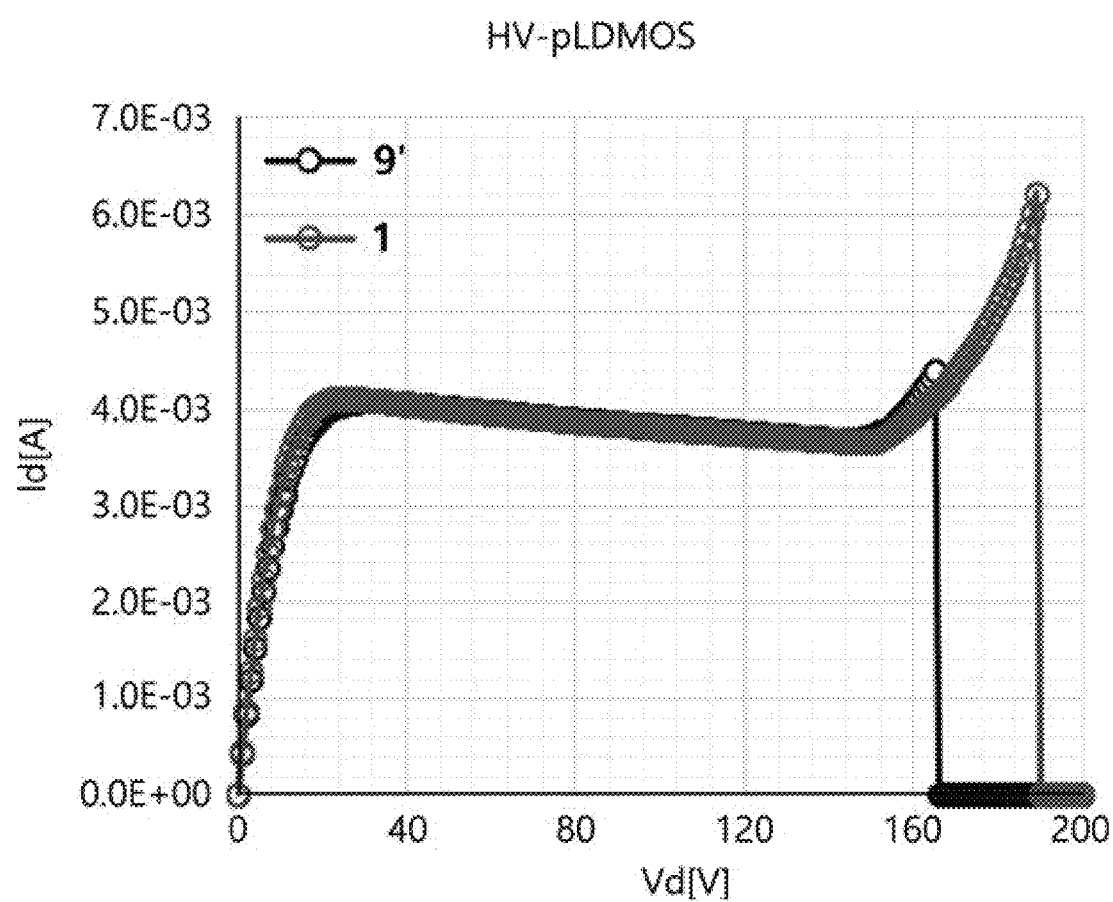
FIG. 11 is a graph showing on-state breakdown voltage values of the high voltage semiconductor device of FIG. 8 and a semiconductor device in which the second drain metal extends along a current path.

FIG. 11 is a graph showing on-state breakdown voltage values of the high voltage semiconductor device of FIG. 8 and a semiconductor device in which the second drain metal extends along the current path (e.g., in the transistor channel).

Referring to FIG. 11, in a comparative semiconductor device in which the drain metal 178 in the core region C1 has a long axis in a direction that is the same as the current path, device destruction occurs when the voltage is about 170V, but the device of FIG. 8 withstands a voltage of up to about 190V as a result of the second drain metal 178 extending into one of the corner regions C2 and/or orthogonally to (e.g., along the y-axis direction in FIG. 8) the direction of the current in the current path.

Figure 12:
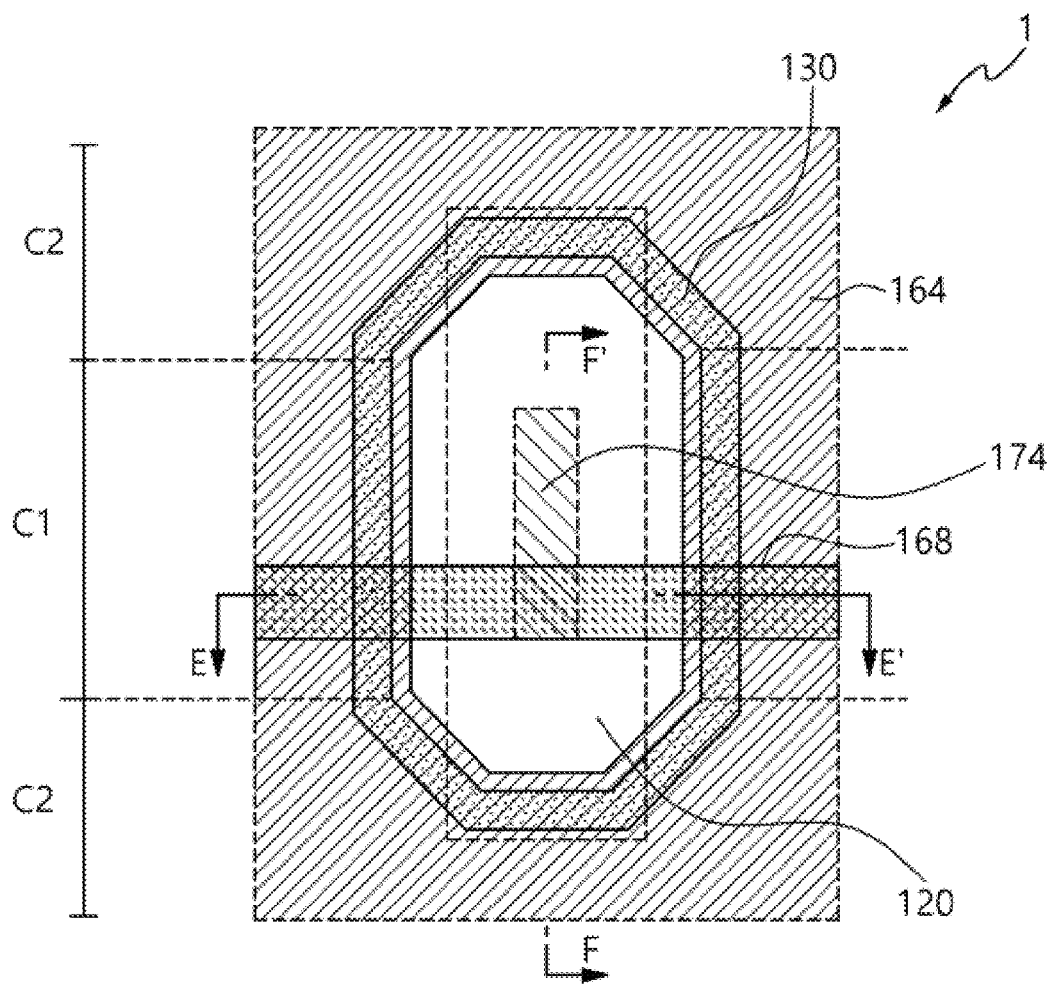
FIG. 12 is a plan view illustrating a high voltage semiconductor device in which a third source metal is added to the high voltage semiconductor device of FIG. 8.
Figure 13:
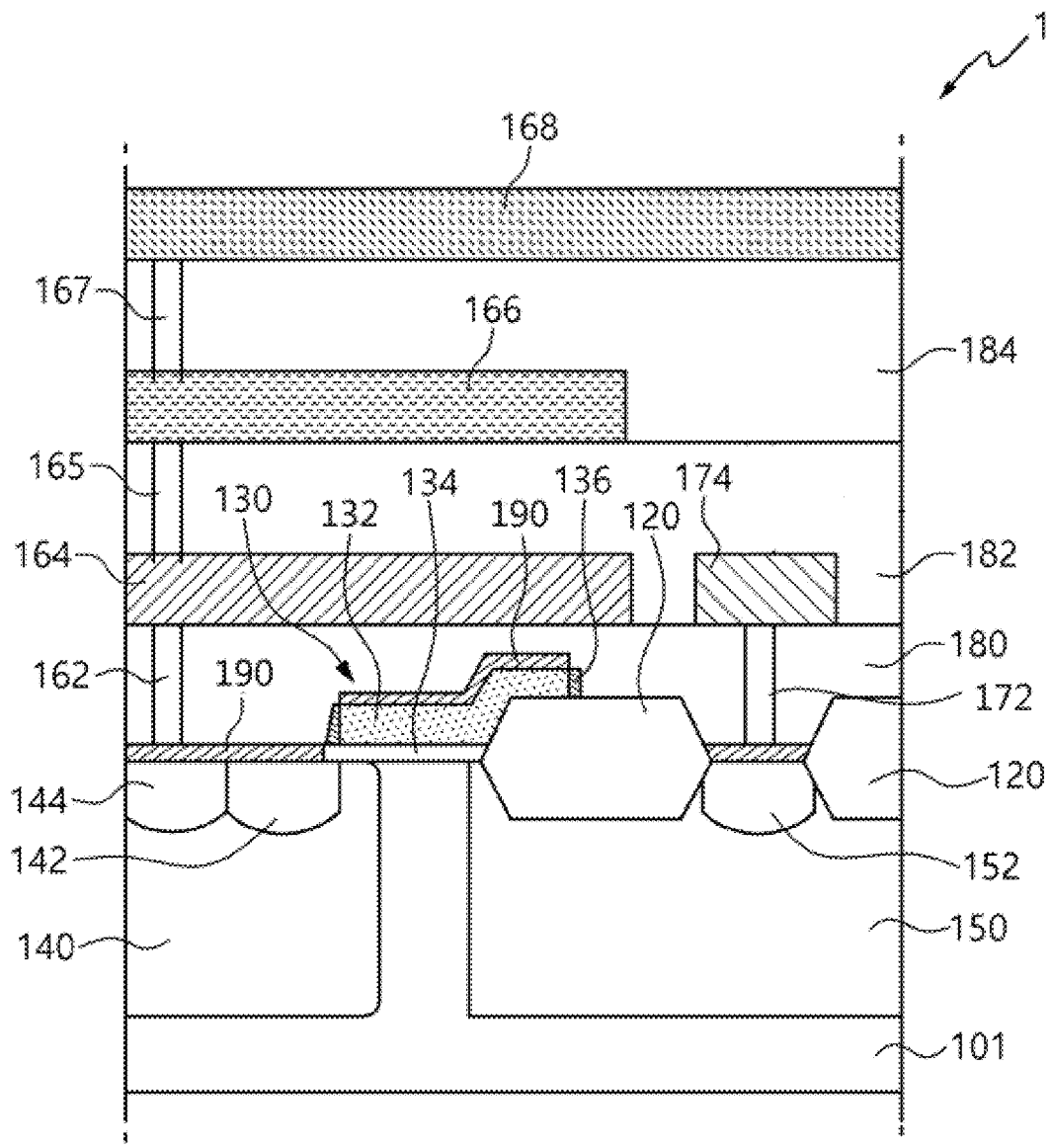
FIG. 13 is a cross-sectional view illustrating the high voltage semiconductor device of FIG. 12 taken along line E-E' in FIG. 12.
Figure 14:
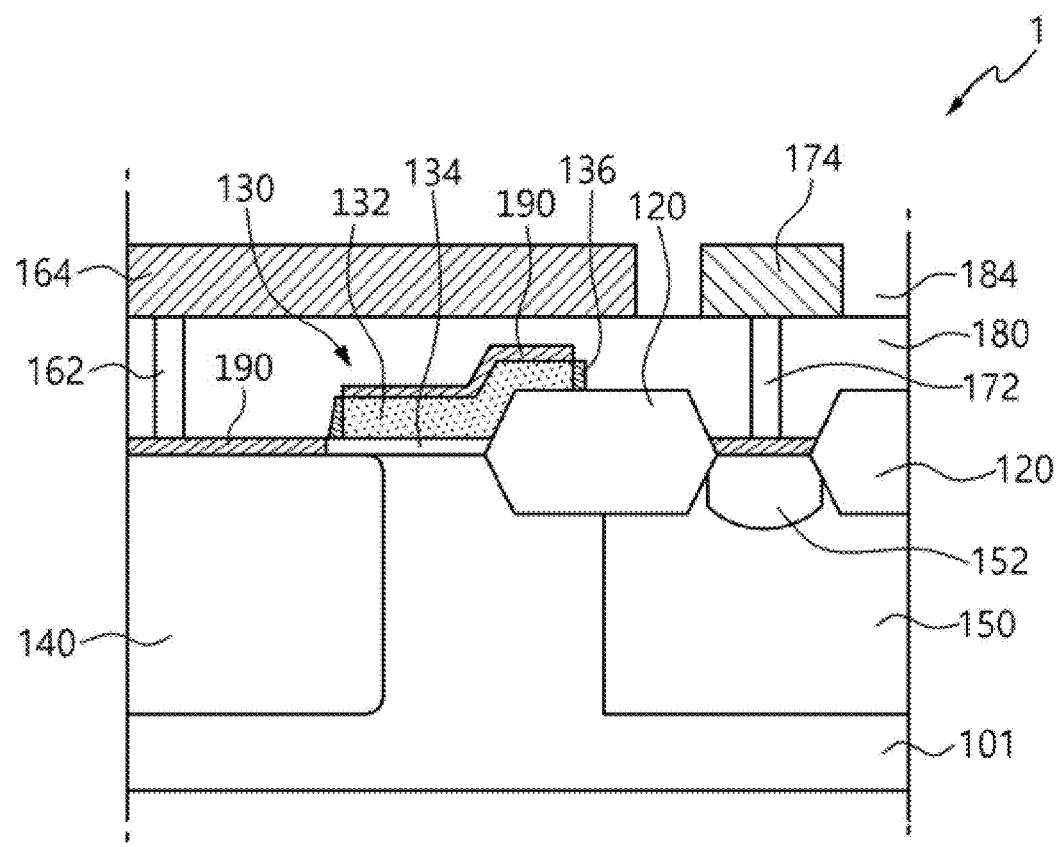
FIG. 14 is a cross-sectional view illustrating the high voltage semiconductor device of FIG. 12 taken along line F-F' in FIG. 12.

FIG. 12 is a plan view illustrating the high voltage semiconductor device of FIG. 8, to which a third source metal is added, FIG. 13 is a cross-sectional view illustrating the high voltage semiconductor device of FIG. 12 taken along line E-E' in FIG. 12, and FIG. 14 is a cross-sectional view illustrating the high voltage semiconductor device of FIG. 12 taken along line F-F' in FIG. 12.

Hereinafter, the high voltage semiconductor device according to still another embodiment (a third embodiment) of the present disclosure will be described in detail with reference to the accompanying drawings. The third embodiment has a structure in which a second source contact 165, a second source metal 166, a third source contact 167, and a third source metal 178 are added, so only the additional structures and/or configuration will be described for convenience.

Referring to FIGS. 12 to 14, on the first source metal 164, the third embodiment may include the second source contact 165 electrically connected to the first source metal 164 and extending upward, and may include the second source metal 166 electrically connected to the second source contact 165. The second source contact 165 may penetrate through the intermediate insulation film 182 that is on the lower insulation film 180. In addition, the second source metal 166 may be the same as or similar to the first source metal 164 so that the second source metal 166 overlaps the first source metal 164 (e.g., in the vertical direction in FIG. 13).

On the second source metal 166, the third source contact 167 is electrically connected to the second source metal 166 and may extend upward and/or penetrate through an upper insulation film 184. In addition, the third source contact 167 is electrically connected to the third source metal 168. The third source metal 168 is only in the core region C1. Specifically, in the core region C1, the third source metal 168 crosses the first drain metal 174. Alternatively or additionally, in the core region C1, the third source metal 168 may cross the gate electrode 132 along the x-axis direction (FIG. 13). The second source contact 164, the second source metal 166, the third source contact 167, and the third source metal 168 may all be or comprise a conductive metal or metal material, as described herein.

In addition, a silicide film 190 may be on each of the source 142, the body contact 144, the uppermost surface of the gate electrode 132, and the drain 152. Generally, in order to improve contact resistance and thermal stability of a MOSFET device, a self-aligned silicide process that forms the silicide film 190 using a metal such as cobalt (Co), nickel (Ni), titanium (Ti), tungsten (W), or the like may be performed.

The foregoing detailed description is for illustrative purpose only. Further, the description provides embodiments of the present disclosure and the present disclosure may be used in other various combination, changes, and environments. That is, the present disclosure may be changed or modified within the scope of the present disclosure described herein, a range equivalent to the description, and/or within the knowledge or technology in the related art. The embodiment shows an optimum state for achieving the spirit of the present disclosure and may be changed in various ways for the detailed application fields and use of the present disclosure. Therefore, the detailed description of the present disclosure is not intended to limit the present disclosure to the disclosed embodiments.

What is claimed is:

1. A high voltage semiconductor comprising:
   a substrate;
   a gate on the substrate;
   a body region in the substrate;
   a drift region in the substrate;
   a source in the body region;
   a drain in the drift region;
   a first source metal electrically connected to the source by a first source contact, the first source metal extending to corner regions from a core region;
   a first drain metal electrically connected to the drain by a first drain contact; and
   a second drain metal above the first drain metal, and the second drain metal electrically connected to the first drain metal by a second drain contact,
   wherein the second drain metal (i) extends up to one of the corner regions from the core region and (ii) has a long axis in a direction about 90 degrees from a current path between the source and the drain.

2. The high voltage semiconductor device of claim 1, wherein the second drain metal extends in a direction substantially orthogonal to the direction of the current path in the core region.

3. The high voltage semiconductor device of claim 1, wherein the second drain metal completely overlaps the first drain metal.

4. The high voltage semiconductor device of claim 1, wherein the gate comprises:
   a gate insulation film on the substrate;
   a gate electrode on the gate insulation film; and
   a gate spacer covering a sidewall of the gate electrode.

5. The high voltage semiconductor device of claim 4, further comprising:
   a gate field plate between the gate and the drain; and
   a device insulation film at a border of the drain.

6. A high voltage semiconductor device comprising:
   a substrate;
   a gate on the substrate;
   a body region in the substrate;
   a drift region in the substrate;
   a source in the body region;
   a drain in the drift region;
   a first source metal electrically connected to the source by a first source contact, the first source metal extending to corner regions from a core region;
   a second source metal electrically connected to the first source metal by a second source contact;
   a third source metal electrically connected to the second source metal by a third source contact, wherein the third source metal is in the core region; and
   a first drain metal electrically connected to the drain by a first drain contact,
   wherein the third source metal overlaps at least a portion of the first drain metal.

7. The high voltage semiconductor of claim 6, wherein the first source metal overlaps the gate in the corner regions.

8. The high voltage semiconductor device of claim 6, wherein the third source metal crosses the gate in the core region.

9. The high voltage semiconductor device of claim 6, wherein the third source metal extends substantially orthogonally to the first drain metal.

10. The high voltage semiconductor device of claim 6, further comprising:
    a gate field plate between the gate and the drain;
    a device insulation film at a border of the drain; and
    a body contact in the body region.

* * * * *